(12) United States Patent
Lechthaler et al.

(10) Patent No.: US 7,960,016 B2
(45) Date of Patent: *Jun. 14, 2011

(54) WEAR RESISTANT HARD COATING FOR A WORKPIECE AND METHOD FOR PRODUCING THE SAME

(75) Inventors: Markus Lechthaler, Feldkirch (AT); Andreas Reiter, Feldkirch (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 706 days.

This patent is subject to a terminal disclaimer.

(21) Appl. No.: 11/747,128

(22) Filed: May 10, 2007

(65) Prior Publication Data

US 2008/0229891 A1 Sep. 25, 2008

Related U.S. Application Data

(63) Continuation-in-part of application No. 11/690,270, filed on Mar. 23, 2007.

(51) Int. Cl.
*B32B 9/00* (2006.01)

(52) U.S. Cl. ......... 428/217; 51/307; 51/309; 204/192.1; 407/119; 428/216; 428/336; 428/469; 428/697; 428/698; 428/699

(58) Field of Classification Search .......... 51/307, 51/309; 428/216, 217, 336, 469, 472, 697, 428/698, 699; 407/119; 204/192.1
See application file for complete search history.

(56) References Cited

U.S. PATENT DOCUMENTS

| 6,586,122 | B2 * | 7/2003 | Ishikawa et al. | 428/699 |
| 7,226,670 | B2 * | 6/2007 | Derflinger et al. | 428/697 |
| 7,348,074 | B2 * | 3/2008 | Derflinger | 428/699 |
| 7,410,707 | B2 * | 8/2008 | Fukui et al. | 428/472 |
| 7,504,149 | B2 * | 3/2009 | Toihara et al. | 428/336 |
| 7,510,761 | B2 * | 3/2009 | Kondo et al. | 428/216 |
| 2008/0318062 | A1 * | 12/2008 | Endrino et al. | 428/428 |

FOREIGN PATENT DOCUMENTS

| WO | WO2006/005217 | * | 1/2006 |
| WO | WO2006/084404 | * | 8/2006 |

* cited by examiner

*Primary Examiner* — Archene Turner
(74) *Attorney, Agent, or Firm* — Notaro, Michalos & Zaccaria P.C.

(57) ABSTRACT

The present invention provides an optimized hard coating and a workpiece, especially a cutting tool coated with a hard coating to increase tooling performance with difficult to machine materials such as high speed steels, titanium alloys, nickel alloys, austenitic steels and especially hard materials like hardened tool steel having a hardness of higher 50, preferably of higher 55 HRC. This is achieved by a workpiece coated with a wear resistant multilayered comprising at least a first supporting layer and a second nanocrystalline layer, whereas the first layer comprises a coating material of the following composition $(Ti_aAl_{1-a})N_{1-x-y}C_xO_y$ with $0.4<a<0.6$, and $0 \leq x$ and $y<0.3$, or $(Al_bCr_{1-b})N_{1-x-y}C_xO_y$ with $0.5<b<0.7$, and $0 \leq x$ and $y<0.3$. The second layer comprises a coating material of the following composition $(Al_{1-c-d-e}Cr_cSi_dM_e)N_{1-x-y}C_xO_y$ whereas M stands for at least one element of the transition metals of group 4, 5, 6 of the periodic system except Chromium and $0.2<c \leq 0.35$, $0<d \leq 0.20$, $0<e \leq 0.04$.

24 Claims, 6 Drawing Sheets

WEAR RESISTANT HARD COATING FOR A WORKPIECE AND METHOD FOR PRODUCING THE SAME

CROSS-REFERENCE TO RELATED APPLICATION

This is a C-I-P of application Ser. No. 11/690,270 filed Mar. 23, 2007 and incorporated here by reference.

BACKGROUND OF THE INVENTION

The present invention relates to a hard and wear-resistant coating designed for tooling of materials difficult to machine such as e.g. hardened tool steels, stainless steels and titanium alloys. Such an application of extreme machining conditions requires a coating having an excellent wear-resistance, hot-hardness and oxidation resistance combined with a high toughness and a good adhesion.

The present invention further relates to the fabrication process of such a wear resistant coating, i.e. a defined PVD arc evaporation process.

It further relates to a coated workpiece, especially a tool having a body made from a cemented carbide, a cermet, a cubic boron nitride (CBN) or high speed steel.

DISCUSSION OF RELATED ART

AlTiN is a widely used PVD coating for machining of hardened steel. However, AlTiN if used as a single layer or multilayer consisting of sublayers of different Ti/Al/N stochiometries can be used up to 900° C. at the most for tooling applications due to incipient declination of hardness with temperatures higher than 800 to 850° C. depending on the Aluminium/Titanium ratio.

Therefore US_2005-0003239 applies AlCrN coatings to workpieces to increase their oxidation resistance. This coating is known to have a good oxidation resistance and hot hardness up to 1100° C. depending on the Aluminium/Chromium ratio. Such coatings help to improve milling performance for many tooling applications however do not significantly improve tooling performance for materials more difficult to machine such as hardened tool steels, high speed steels, titanium and nickel alloys and austenitic steels. Similar to that, application also WO-2006/005217, WO-2006/084404 and US 2006-0222893 try to further optimize oxidation resistance, and/or (hot) hardness of the coatings by using different multilayers and/or introducing other elements into the AlCrN matrix.

Another coating which is asserted to make progress with cutting of hardened steels is disclosed by EP 1690959. The coating comprises a two-layer system based on (TiAlSi)N of different Al and Si stochiometry.

US 2006-0269789 discloses a hard multilayer to cut high hardness material at a high speed. The multilayer comprises a first TiAlCrNX (X=C or O) based coating layer, a second coating layer being a mixture of TiAlCrNX and TiAl(SiC)NX or a multilayer of such alternating layers, and a third outermost coating layer essentially consisting of TiAl(SiC)NX.

Despite of certain progress which could be achieved with such layer systems in terms of wear and oxidation resistance, there still seems to be a need to further improve performance of coated cutting tools with as mentioned difficult to machine materials.

SUMMARY OF THE INVENTION

Therefore one object of the present invention is to provide an optimized hard coating and a workpiece, especially a cutting tool coated with a hard coating to increase tooling performance with difficult to machine materials such as high speed steels, titanium alloys, nickel alloys, austenitic steels and especially hard materials like hardened tool steel having a hardness of higher 50, preferably of higher 55 HRC. A further object of the invention is to provide such coatings without loosing the excellent oxidation and hot hardness properties of AlCrN. These objects may be achieved by any one of the first two aspects of the invention as described below and in claims 1 and 2. A third object of the invention is to provide an improved cutting tool according to claim 12 used to fabricate parts for mechanical assemblies like e.g. moulds and dies, and other cutting tools like blades as well as a cutting process to perform such operations according to claim 16. One application focus is the improvement of the cutting performance in milling operations with reference to cost reduction, optimization of production sequences and an improved surface roughness of the workpiece as for example.

A fourth object of the invention is to provide a PVD process to produce inventive coatings and inventive tools according to claim 13.

Surprisingly the first and second object of the invention can be solved by a workpiece having a surface whereas at least parts of said surface are coated with a wear resistant multi-layered hard coating deposited by a PVD process and the hard coating comprises at least a first supporting layer and a second nanocrystalline silicon containing layer with the first layer interposed between the workpiece and the second layer, which is a first aspect of the present invention.

The first layer comprises a coating material of the following composition $(Ti_aAl_{1-a})N_{1-x-y}C_xO_y$, whereas $0.4 < a < 0.6$, and $0 \leq x$ and $y < 0.3$. Alternatively the first layer may comprise $(Al_bCr_{1-b})N_{1-x-y}C_xO_y$, whereas $0.5 < b < 0.7$ and $0 \leq x$ and $y < 0.3$.

The second layer comprises a coating material of the following composition $(Al_{1-c-d-e}Cr_cSi_dM_e)N_{1-x-y}C_xO_y$, whereas M stands for at least one element of transition metals of group 4 (Ti, Zr, Hf), 5 (V, Cb[Nb], Ta), 6 (Cr, Mo, W) of the periodic system except chromium, and $0.2 < c \leq 0.35$, $0 < d \leq 0.20$, $0 < e \leq 0.04$. In a preferred embodiment of the invention the second layer comprises a coating material of the following composition $(Al_{1-c-d-e}Cr_cSi_dM'_e)N_{1-x-y}C_xO_y$, whereas M' stands for W, Mo, Ta or Cb [Nb] and $0.06 < d' \leq 0.15$, especially with $0.10 \leq d' \leq 0.11$. (Niob or Columbium refers to element 41 of the periodic system, international shortcut Nb, sometimes also Cb)

Further aspects of the invention are directed to the crystalline structure of the second layer which preferably comprises two different phases, especially a cubic face centered (fcc) and a hexagonale close packed (hcp) phase. Thereby the XRD signal of the hcp phase may become more prone if subject to heat treatment or high working temperatures of at least 700° C. or 750° C. The hcp phase can be Al enriched and the percentage of the hexagonale phase as deposited should be between 5 to 40 Vol %, preferably between 10 and 30 Vol %.

Further aspects of the invention are directed to the Al/Cr ratio within the nanocrystalline layer, to the ratio of the thickness of the first and second layer and overall coating thickness, to layer textures and structure as well as to a multilayer of alternating first and second layers. As for example performance of as coated cutting tools seems to be especially good when the Al/Cr ratio as expressed by the quotient $Q_{Al/Cr}=(1-c-d-e)/c$ is within the following range: $1.5 < Q_{Al/Cr} \leq 2.4$.

In a further embodiment a thickness $D_1$ of the first coating is smaller than a thickness $D_2$ of the second coating, e.g. the quotient $Q_D = D_2/D_1$ is within the following range: $1 < Q_D \leq 4$, whereas overall coating thickness D of inventive coatings is within the following range: 1 µm≦D≦10 µm and preferably 2 µm≦D≦6 µm.

A further aspect of the invention refers to hardness and Young's modulus of the defined layers of the coating system. A higher hardness of the nanocrystalline layer compared to the support layer proved to be advantageous. As for example the first layer preferably shows a hardness between 2.400 until 2.800 HV, whereas the second layer will have a hardness between 2.800 and 3.200 HV measured by a Vickers microindentation at a load of 40 mN. Hardness and Young's modulus—the latter influencing toughness of a coating system to a high extent—can be adjusted as for example by controlling certain process parameters especially substrate bias and process pressure or reactive gas pressure as known to the man of art from U.S. Pat. No. 6,071,560 and U.S. Pat. No. 6,274,249 and other documents.

However, for the present invention it has been proved advantageously to use a deposition process comprising the step of applying a first lower substrate voltage $U_1$ during deposition of the first coating and applying a second higher substrate voltage $U_2$ during deposition of the second coating. Whereas the first substrate voltage is in the range of $0 V \leq U_1 \leq 100 V$ and the second substrate voltage is in the range of $80 V \leq U_2 \leq 200 V$, whereas $U_2 - U_1 \leq 20 V$. Additionally or alternatively a higher process pressure may be used during deposition of the first coating to reduce intrinsic layer stress and therewith hardness of the first layer. Heating workpieces to temperatures of higher than 550° C., especially to about 600° C. and holding them at this temperature level during the deposition process seemed to give a further beneficial influence to coating adhesion and tool performance.

A further possibility to influence as mentioned layer properties is to vary the content of certain additional elements or to vary the Al/Cr ratio as mentioned above or with examples below. The hardness of the second nanocrystalline alloyed AlCrN-based layer can be further advanced by adjusting the silicon content to give an optimum in grain refinement resulting in a maximum of hardness. Furthermore, a contributive solution hardening is obtained by as mentioned transition metals, especially of W, Mo, Cb and Ta, which additionally serve as diffusions barrier as e.g. in the grain boundary phase of the hard coating. Altogether, such nanocrystalline alloyed Al/CrN based layers proved to be extremely resistant against high temperatures and oxidation, and therefore being highly effective in protecting the support layer and the substrate from being oxidized. Best performance with cutting operations could be achieved with a texture coefficient $Q_I=I(200)/I(111)$ in the range of $0.7 \leq Q_I \leq 2$ ($Q_I$ is defined as the ratio of the diffraction intensities I(200) to I(111), assigned respectively to the (200) and (111) plains in the X-ray diffraction spectrum of a material). This corresponds to a balanced growth along (200) and (111) plains. Details regarding the measurement can be seen with FIG. 1.

Contrary to the second layer the support layer exhibits a columnar growth structure and a higher elasticity through a higher Young's modulus. This proved to be the best combination to transfer mechanical load from the extremely wear and high temperature resistant second layer to the substrate material of the workpiece.

Alternatively to the two layer set up as described above other layer system can be used to further improve layer performance for special applications. As for example a thin metallic adhesion layer may be used to give an optimized interface between the substrate and the first supporting layer. This adhesion layer may comprise Ti, Cr, TiAl or AlCr and may have a transition zone with growing N, C and/or O content towards the first layer as known to the man of the art.

Another or additional possibility is to make the first layer comprise a multilayer of alternating $(Ti_aAl_{1-a})N_{1-x-y}C_xO_y$ and $(Al_{1-c-d-e}Cr_cSi_dM_e)N_{1-x-y}C_xO_y$ layers or of alternating $Al_bCr_{1-b})N_{1-x-y}C_xO_y$ and $(Al_{1-c-d-e}Cr_cSi_dM_e)N_{1-x-y}C_xO_y$ layers. Layers of this stack will have a preferred layer thickness of a view nanometer until some 100 nanometers to the maximum which may be varied within the layer stack up to the needs.

Workpiece body or substrate material will be preferably selected at least from one of the followings like high-speed steel, cemented carbide, cubic boron nitride, cermet or a ceramic material. Such coated workpieces can be used for many types of tools, however will be especially useful for cutting tools, as for instance end mills, drills, cutting inserts, or gear cutting tools like hobs. When applied to tools made of cemented carbide, cubic boron nitride, cermet or a ceramic material these coatings have a good potential to improve cutting performance with cutting processes on hard materials—as e.g. hardened steel—having a Rockwell hardness of HRC 50 and higher, or even of HRC 55 and higher as will be demonstrated in detail with examples below.

BRIEF DESCRIPTION OF THE DRAWINGS

The following figures and examples are intended to explain the present invention by means of some specific embodiments which are not intended to restrict the scope of the claims in any way. Reference is being made to the accompanying drawings in which

Figure 1:
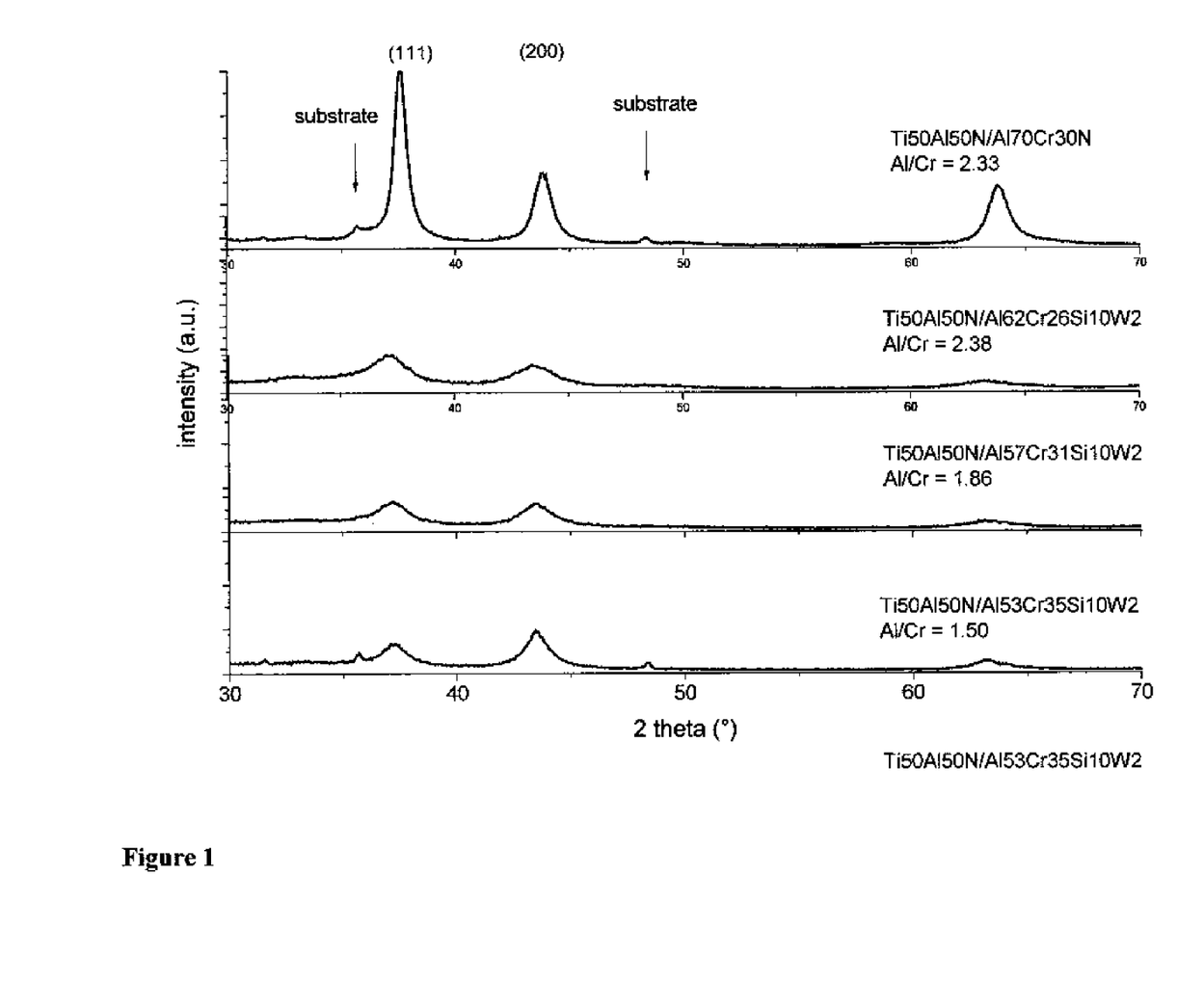
FIG. 1 shows XRD spectra of a TiAlN/AlCrN and TiAlN/AlCrSiWN hard coatings.

FIG. 1 shows XRD-patterns of a TiAlN/AlCrN and three TiAlN/AlCrSiWN coatings of varying Al/Cr-ratio. The coatings were deposited on a commercially cemented carbide insert having a cobalt binder phase and correspond to coatings No 1.6, 2.4, 2.5 and 2.6 from examples 1 and 2. Coating parameters were the same for all coatings with the exception of the target material used to deposit the second layer. Details on targets composition as well on features of the coatings can be seen with table 1 and 2.

All XRD spectra were recorded with a Bruker AXS equipment with a Cu $K_\alpha$ ($\lambda$=1.5406 nm) source using a Bragg-Brentano geometry at a glancing incidence of 2° to minimize disturbing diffraction signals coming from the support layer and the substrate.

Figure 3:
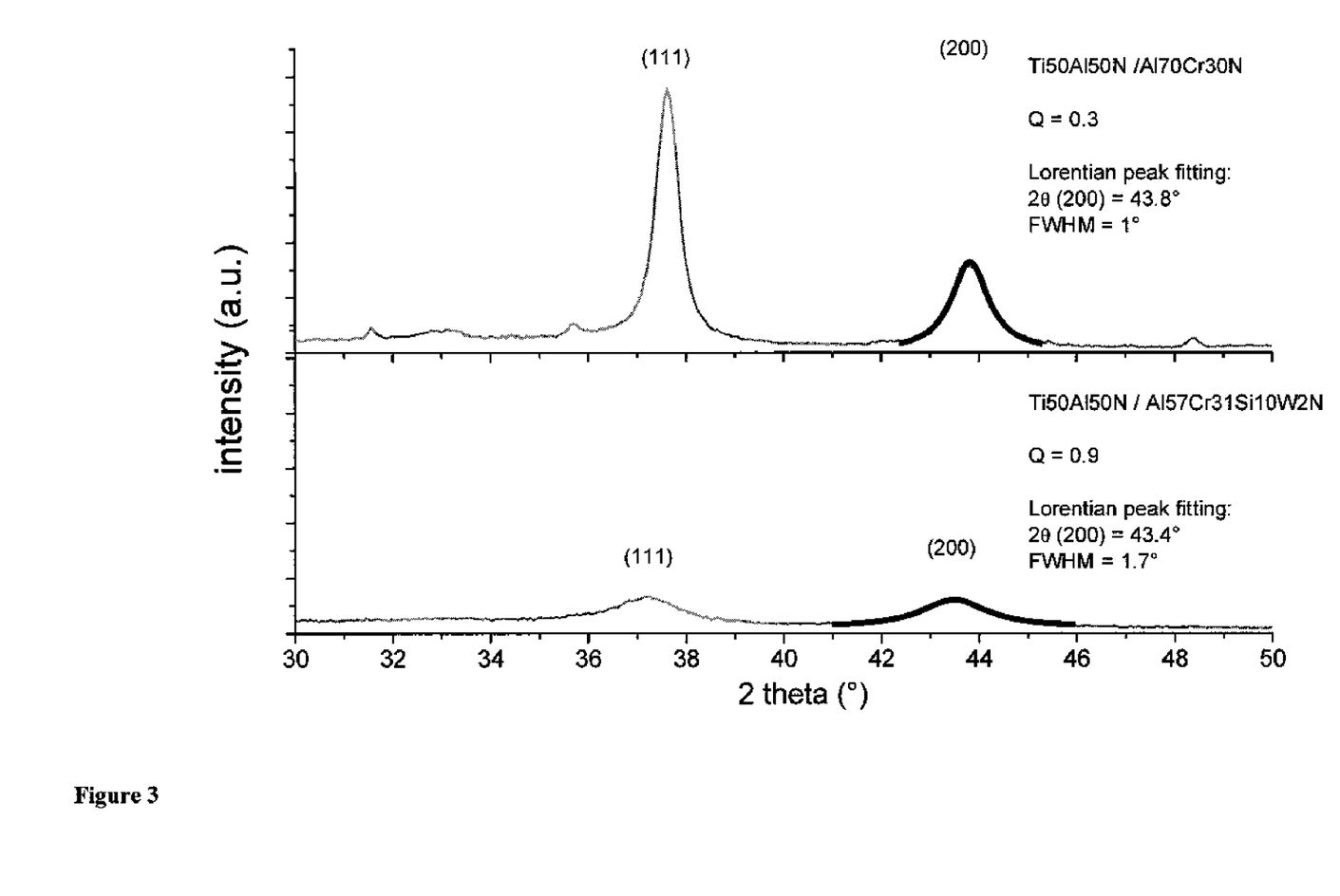
FIG. 3 is a SEM cross-section of a TiAlN/AlCrN and TiAlN/AlCrSiWN hard coating.

Two important facts can be deduced from the spectra:
Using W and Si alloyed AlCr targets causes a decrease of peak heights of the coatings' diffraction patterns combined with a broadening of the peak signal. This can be attributed to a grain refining effect due to the alloying elements, especially of the silicon. Due to this AlCrSiWN second layers are deposited with a nano-crystalline structure, as can be seen also with the SEM images cross section of FIG. 3b.

Compared to coating systems having an unalloyed second AlCrN layer displaying a clear (111) orientation, systems with an alloyed second layer display no or only a weak preference in crystal orientation. Therefore a term $Q_I$ which is defined as the ratio of the diffraction intensities I(200) to I(111), assigned respectively to the (200) and (111) plains in the X-ray diffraction spectrum of a material, is in the region of 1, preferably between 0.7 and 2, if measured by glancing incidence as mentioned above.

Figure 2:
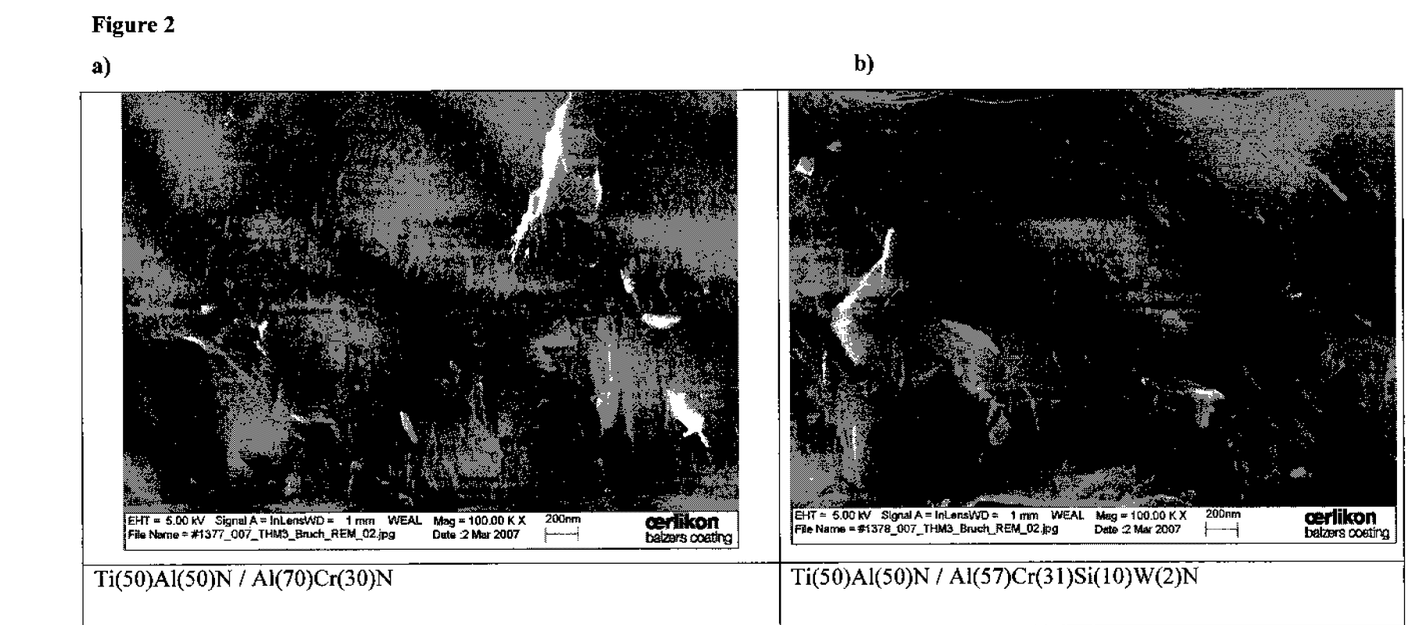
FIG. 2 shows a fitted XRD spectra of a TiAlN/AlCrN and a TiAlN/AlCrSiWN hard coating.

More detailed information on the coating structure can be deduced from XRD-patterns if peak fitting according to the Lorentian method is applied as can be seen with FIG. 2. The fitting has been applied to the (200) signals near 44.5° on the 2Θ scale from spectra referring to coatings No 1.6 and No 1.9. Thereby widening can be quantified by measuring the Full peak Width at Half Maximum (FWHM). Excluding constant background influence of the apparatus the following values, showing a pronounced peak broadening with an AlCrSiWN second layer, were obtained:

TiAlN/AlCrSiWN: FWHM (200)=1.7°

TiAlN/AlCrN: FWHM (200)=1°

Alloying AlCrN coatings with Si and W leads to a peak-shift from 43.8° towards a lower 2-theta angle of 43.4°, which the authors attribute to a widening of the lattice plain due to the bigger size of tungsten atoms. Thereby lattice parameter change from d(200)=2.064 nm for AlCrN to d(200)=2.082 nm for AlCrSiWN.

SEM images of two coating cross sections with magnification of 100,000 diameters can be seen with FIGS. 3a and 3b. SEM images were recorded at an acceleration voltage of 5 kV. Pictures show two double layered coatings, each having a columnar grown $(Ti_{0.5}Al_{0.5})N$ supporting layer of about 1 μm thickness and a thicker top layer. Thereby FIG. 3a shows an AlCrN top layer having already a finer layer than the comparably coarse and columnar first layer. However structure of the $(Al_{0.57}Cr_{0.31}Si_{0.10}W_{0.02})N$ second layer in FIG. 3b exhibits a significantly finer nano-crystalline structure compared to FIG. 3a which corresponds to the peak-broadening as observed with XRD spectra of FIGS. 1 and 2.

Figure 4:
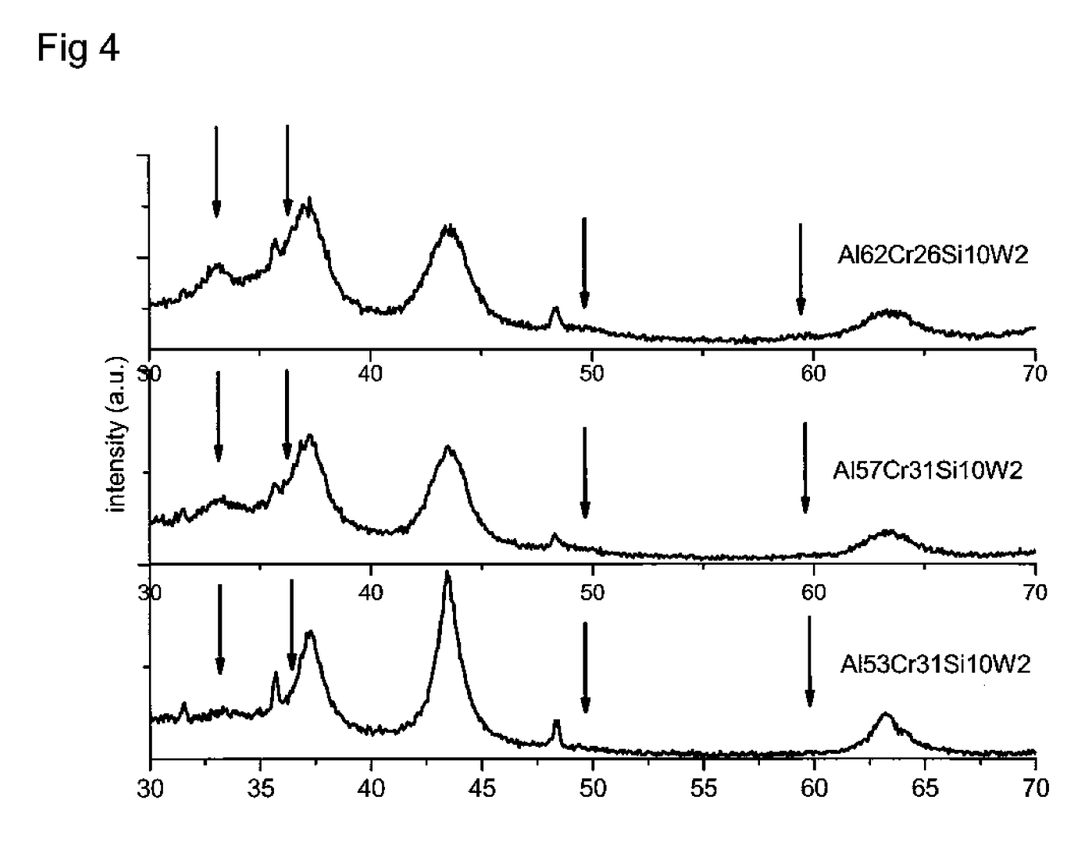
FIG. 4 shows XRD spectra of TiAlN/AlCrSiWN hard coatings with hexagonal phase.

In FIG. 4 XRD spectra of TiAlN/AlCrSiWN hard coatings of FIG. 1 are displayed in a higher resolution mode with 29 numbers indicated by arrows where hexagonal phase peaks should appear. It can be clearly recognized that referring hexagonal peaks get more and more pronounced with growing Aluminium content of the AlCrSiWN coating, which goes with good cutting performance of coatings No 1.6, 2.4, 2.5.

Figure 5:
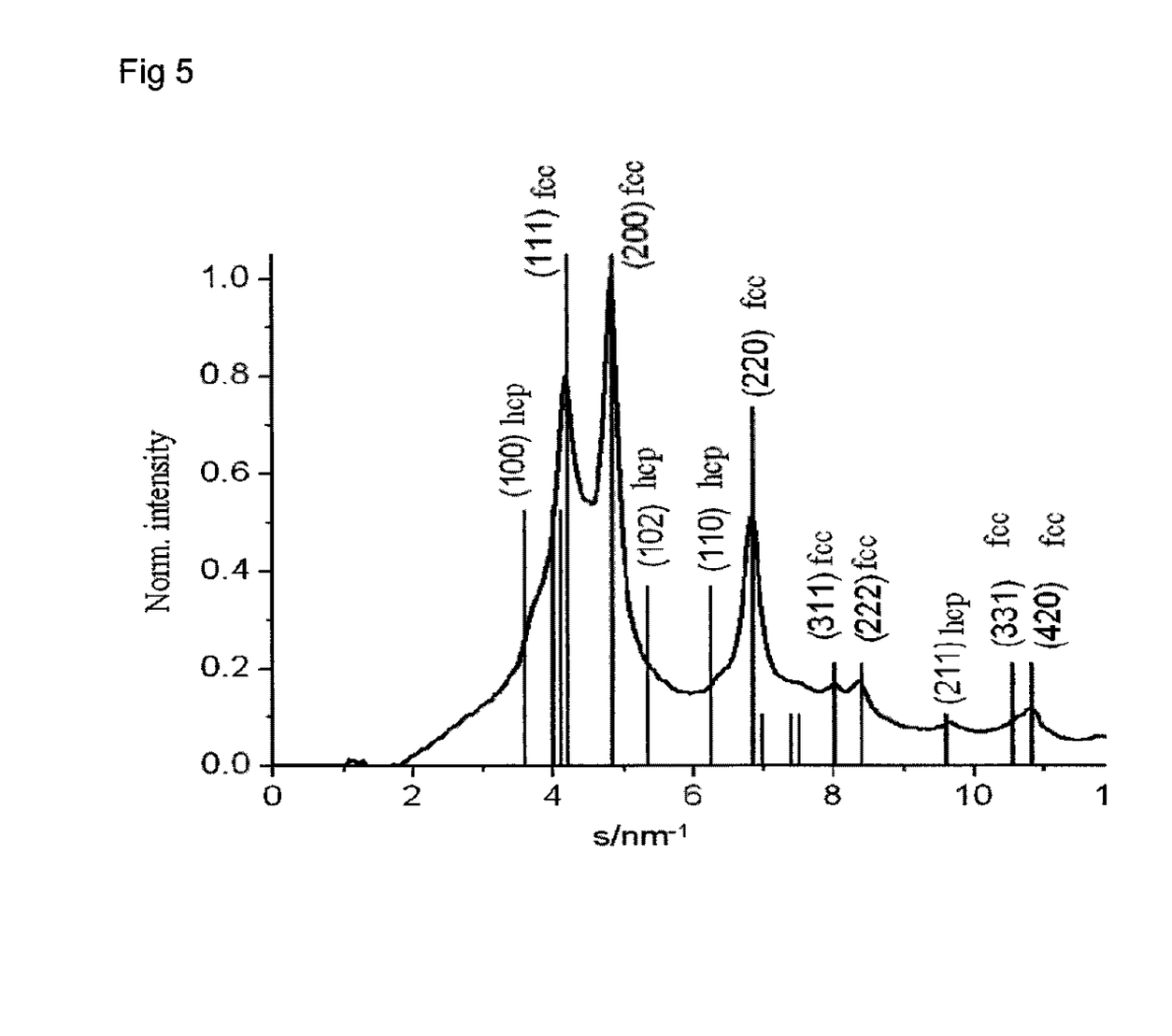
FIG. 5 is a peak intensity diagram.

FIG. 5 is a peak intensity diagram as analyzed by TEM-SAED (Transmission Electron Microscopy—Selected Area Electron Diffraction) to give a more detailed picture of the cubic and hexagonal patterns from a TiAlN/$(Al_{0.62}Cr_{0.26}Si_{0.10}W_{0.02})N$ coating. Stochiometry numbers of the compound refer to target composition.

Figure 6:
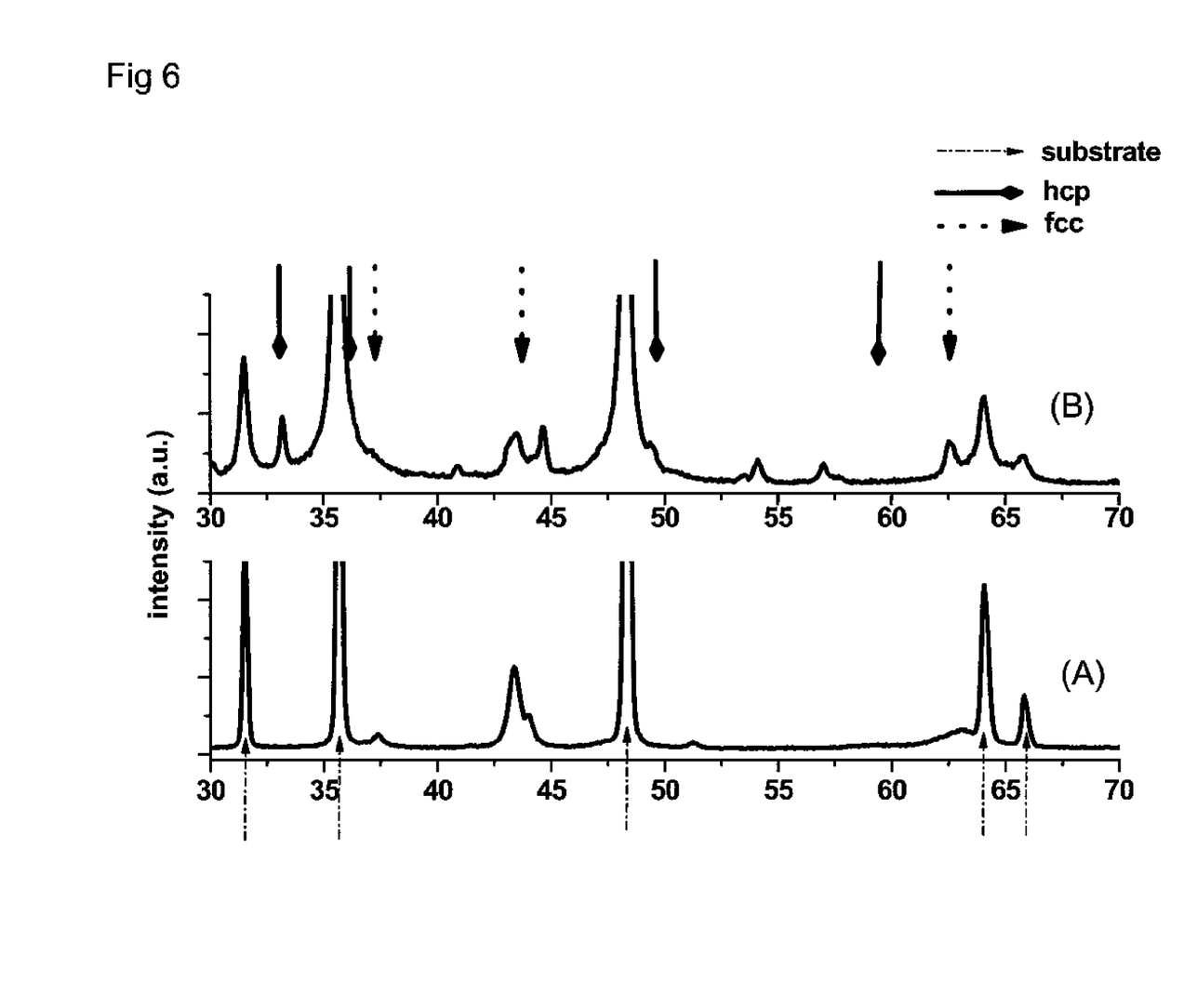
FIG. 6 shows XRD spectra of TiAlN/AlCrSiWN on a cutting tool before and after use.

With FIG. 6 an XRD spectra of a TiAlN/$(Al_{0.57}Cr_{0.31}Si_{0.10}W_{0.02})N$ coating is shown as deposited after the PVD process (A) and as used according to a high speed side milling process (B) with chips blazing bright red as described in detail with example 8. Details on target composition, thickness ratio and performance see table 8. Spectrum (B) which has been made after about 40 m of milling surprisingly shows distinct higher hexagonal XRD signals. Similar growth of hexagonal phase percentage could be seen by tempering such coatings to at least 750° C. The minimum percentage of Al to observe such temperature triggered phase transitions was between 49 and 57%, depending on the matrix of further elements, which can be easily determined by the man of the art as the case arises. From 750° to 800° C. onwards hexagonal phase seems to grow with increasing temperature until at least 1100° C. Within the temperature range of 600° C., that may be as deposited by the PVD process, until about 1100° C. a precipitation hardening network made out of hcp phase of high AlN content embedding cubic phase crystallites could be detected in cross sectional STEM analysis. Size of crystallites at 750° C. was between 5 to 200 nm. With most cutting tests such coatings were superior to coatings showing no phase transition and a higher Al-target composition like 57% seemed to perform better. This is the more surprising as up to now alumina coatings having a stable corundum phase over the whole temperature range from room temperature to any temperature which can be achieved by high speed tooling seemed to have an unbeatable benefit when it comes to extreme high thermal load of the coating. For (AlCrSiW)N coatings however phase transition seems to have beneficial effect which might be due to a continuous proliferation of high temperature stable aluminium nitride phase during cutting processes. Peak positions of the 33.2° peak as seen with FIG. 6 (B) seems to fit perfectly with hcp 100 peak of hexagonal closed packed hcp-AlN from the JCPDS XRD data collection. Further AlN peaks, which could be unambiguously recognized, are at 36.1 (refers to 002 signal), 49.2° (102), 59.4° (110) and 101.6° (211). In any case until now only presumptions can be made on the reasons for such temperature induced phase transition behavior. Detailed investigations are still to be done. When Al percentage exceeds about 70%, hcp-AlN-phase turns to be the main phase and such phase transition cannot be longer observed.

DETAILED DESCRIPTION OF THE PREFERRED EMBODIMENT

In the following some specific embodiments of the invention are disclosed by means of examples, comparing cutting performance of inventive tools with tools of the state of the art using different cutting operations and cutting parameters.

All inventive hard coatings and comparative examples have been deposited using an Oerlikon Balzers RCS® coating system, in the arc evaporation configuration. Cutting tools were mounted on threefold rotating fixtures during PVD deposition. Hard coatings deposited on cutting tools as described in the examples below had an overall thickness between 2 and 6 μM measured on the shank of the cutting tool. The new coatings were compared to state of the art coatings obtained by Oerlikon Balzers standard coating processes for TiAlN so-called FUTURA NANO, AlTiN so-called XCEED and AlCrN so-called ALCRONA.

EXAMPLE 1

With example 1 cutting performance of endmills coated with state of the art coatings like TiAlN, AlTiN, AlCrN and (AlCrSiW)N has been compared to a serial of inventive endmills coated with TiAlN or AlCrN/$(Al_{1-c-d-e}Cr_cSi_dW_e)N$ double layered coatings.

All coatings have been synthesized by cathodic arc evaporation. Deposition of coatings No 1.4 to No 1.10 has been conducted at a deposition temperature of 600° C. and a total pressure of 3.5 Pa under nitrogen atmosphere. For the first support layer a low bias voltage preferably between −40 V and −100 V has been applied while for the second layer a higher bias voltage of −80 V to −200V has been used, whereas absolute value of bias voltage of the second layer was at least 20 V, preferably 40 V higher than bias voltage of the first layer. Deposition of coatings No 1.1 to No 1.3 has been conducted at a deposition temperature of 500° C. and a total pressure of 3.0 to 4.0 Pa under nitrogen atmosphere.

Data with reference to composition of respective evaporation materials (targets), Al/Cr ratio within the second nanocrystalline coating layer (m.l.) of the coating, thickness ratio $Q_D$ of the layers (m.l./s.l.), and the resulting cutting performance expressed by flank wear in micrometers after a cutting length of 90 m has been reached, and accumulated tool-life in meters when a wear mark of 100 μm has been reached, are summarized in table 1.

Milling Conditions:

| | |
|---|---|
| Work piece: | DIN 1.2379 (60 HRC) |
| Cutting tool: | 2-fluted ball nose end-mill, Ø 10 mm, micro grain carbide grade |
| Spindle rotation: | 8000 min − 1 |
| Cutting speed: | 200 mmin − 1 |
| Feed rate: | 0.1 mm/tooth |
| Radial depth of cut: | 0.5 mm |
| Axial depth of cut: | 0.3 mm |
| Coolant: | compressed dry air |
| Milling operation: | down milling |
| Length of single pass: | 30 m |
| End of lifetime: | $v_{bmax}$ > 100 um at the end a single pass |

With table 1 performance of comparative examples 1.3 to 1.6 is poor compared to inventive tools coated with a double layer structure. Despite of a pronounced improvement of single layered AlCrSiWN coatings of examples 1.4 to 1.5 when compared to the unalloyed AlCrN coating of example 1.3, or the TiAlN/AlCrN double layer of example 1.6, these coatings cannot be compared with performance of inventive examples 1.7 to 1.8. However, thickness ratio $Q_D$ of inventive double layers seems to be an important issue as shown with the weak performance of example 1.10 for coatings with a thin silicon containing layer.

EXAMPLE 2

With example 2 the same deposition parameters were applied as with example 1.

With experiments 2.1 to 2.3 Si content of the second coating is varied at a constant Al/Cr ratio, with experiments 2.4 to 2.6 ratio of Al/Cr is varied at constant Si content. Only small variations of tungsten—around 2±0.3% to the maximum—were measured for all experiments of example 2, as displayed in table 2.

Milling Conditions:

| | |
|---|---|
| Work piece: | DIN 1.2379 (60 HRC) |
| Cutting tool: | 2-fluted ball nose end-mill, Ø 10 mm, micro grain carbide grade |
| Spindle rotation: | 8000 min − 1 |
| Cutting speed: | 200 mmin − 1 |
| Feed rate: | 0.1 mm/tooth |
| Radial depth of cut: | 0.5 mm |
| Axial depth of cut: | 0.3 mm |
| Coolant: | compressed dry air |
| Milling operation: | down milling |
| Length of single pass: | 30 m |
| End of lifetime: | $v_{bmax}$ > 100 um at the end a single pass |

In table 2, at constant Si content (No. 2.4-2.6) hardness measurements show a decrease of hardness with increasing Al/Cr-content of the second coating. At constant Al/Cr-ratio a maximum of the hardness and cutting performance can be seen at a Si content around 10%. Furthermore, it can be seen clearly, that the Si-content has to be at least higher than 5.3% to obtain a good cutting performance.

Parameters and configuration as used for XRD analysis to define $Q_I$ values as mentioned above have been described in detail with FIG. 1. Whereby the (111)-peak used to define the quotient is situated at a 2-Θ-angle of around 37.5°, and the referring (200) peak is situated at about 43.7°. Preferentially the value of Q=I(200)/I(111), measured at a glancing incidence of 2° is found in the region of 1, especially between 0.7 and 2.

EXAMPLE 3

Milling capacity of innovative coating No 3.4 has been compared to state of the art coatings No 3.1-3.3 during a roughing operation according to the parameters mentioned below. With example 3 the same referring deposition parameters were applied as mentioned with example 1.

Milling Conditions:

| | |
|---|---|
| Work piece: | DIN 1.2344 (52 HRC) |
| Cutting tool: | 2-fluted ball nose end-mill, Ø 10 mm, micro grain carbide grade |
| Spindle rotation: | 4690 min$^{-1}$ |
| Cutting speed: | 80 mmin$^{-1}$ |
| Feed rate: | 0.15 mm/tooth |
| Radial depth of cut: | 4 mm |
| Axial depth of cut: | 0.8 mm |
| Coolant: | compressed dry air |
| Milling operation: | down milling |
| Length of single pass: | 15.5 m |
| End of lifetime: | $v_{bmax}$ > 150 um at the end a single pass |

TABLE 3

| No. | coating | target composition support layer s.l. (% at) | | | target compostion main layer m.l. (% at) | | | | | thickness ratio m.l./s.l. | cutting performance lifetime at vb = 200 um (m) |
|---|---|---|---|---|---|---|---|---|---|---|---|
| | | Al | Cr | Ti | Al | Cr | Ti | Si | W | | |
| 3.1 | TiAlN | — | — | — | 50 | — | 50 | — | — | — | 93 |
| 3.2 | AlTiN | — | — | — | 66 | — | 33 | — | — | — | 162 |
| 3.3 | AlCrN | — | — | — | 70 | 30 | — | — | — | — | 181.5 |
| 3.4 | TiAlN/AlCrSiWN | 50 | — | 50 | 57 | 31 | — | 10 | 2 | 1.84 | 264 |

EXAMPLE 4

The same new coating as used in No 3.4 has been used in No. 4.4 to compare the performance with state of the art coatings 4.1 to 4.3 during a finishing operation in annealed tool steel having a hardness of 36 HRC.
Milling Conditions:

| | |
|---|---|
| Work piece: | DIN 1.2344 (36 HRC) |
| Cutting tool: | 3-fluted end-mill, Ø 8 mm, micro grain carbide grade |
| Spindle rotation: | 4777 min − 1 |
| Cutting speed: | 120 mmin − 1 |
| Feed rate: | 0.05 mm/tooth |
| Radial depth of cut: | 0.5 mm |
| Axial depth of cut: | 0.10 mm |
| Coolant: | compressed dry air |
| Milling direction: | down milling |
| Length of single pass: | 5 m |
| End of lifetime: | $v_{bmax}$ > 100 um at the end a single pass |

TABLE 4

| No. | coating | target composition support layer s.l. (% at) | | | target compostion main layer m.l. (% at) | | | | | thickness ratio m.l./s.l. | cutting performance lifetime at $vb = 150$ um (m) |
|---|---|---|---|---|---|---|---|---|---|---|---|
| | | Al | Cr | Ti | Al | Cr | Ti | Si | W | | |
| 4.1 | TiAlN | — | — | — | 50 | — | 50 | — | — | — | 25 |
| 4.2 | AlTiN | — | — | — | 66 | — | 33 | — | — | — | 30 |
| 4.3 | AlCrN | — | — | — | 70 | 30 | — | — | — | — | 65 |
| 4.4 | TiAlN/AlCrSiWN | 50 | — | 50 | 57 | 31 | — | 10 | 2 | 1.84 | 80 |

The significant improvement in performance compared with state of the art coatings proves the potential of the new coatings with machining of softer steels.

EXAMPLE 5

With example 5 prior to cutting application a brushing treatment using a brushing machine according to DE 20 2006 000 654 1 has been applied to coatings in order to adjust a state comparable to an initial homogeneous wear, which ensures afterwards a homogeneous progress of the wear during the cutting application.

The treatment of the coated tool has been conducted with rotary brushes according to DEGM 20 2006 000 645.1 FIG. 2 and referring description on page 5 last paragraph until page 6 end of first paragraph which is thereby included by reference to the present application. Brush angle was about 30° with reference to the tool axis, rotation speed 650 rev/min, Brushing material was SiC impregnated Nylon, SiC grain size 400 mesh, diameter of bristles 0.45 mm, length of bristles 35 mm. Rotation of the tool satellite was 9 rev/min, rotation of the table supporting the satellites was about 0.3 rev/min. A similar effect to dissect a few micrometers' stripe of the workpiece material along the cutting edge could be achieved by using $Al_2O_3$ impregnated brushes. In this case however brushing time has to be tripled if the same parameters as mentioned above should be used (e.g. rotation of the supporting table is set to 0.1 rev/min).

Coatings have been deposited according to parameters with No 1.2 and No 1.8.

Milling Conditions:

| | |
|---|---|
| Cutting tool: | 2-fluted ball nose end mill, 5 mm ball radius, micro grain carbide grade |
| Workpiece: | 1.2379 62 HRC |
| Spindle rotation speed: | 6000 rev/min |
| Axial depth of cut: | 0.4 mm |
| Radial depth of cut: | 0.05 mm |
| Feed rate: | 0.10 mm/tooth |
| Cutting speed: | 184 m/min |
| Feed: | 600 mm/min |
| Coolant: | air |
| Milling operation: | down milling technique for pockets (56 mm × 26 mm) |
| Length of single pass: | 1 Pocket |
| End of lifetime: | $v_{bmax}$ > 100 um at the end of a pocket |

Milling data with table 5 show that brushing treatment with such cutting operations is extremely useful for tools coated with new multilayered coatings (5.3 and 5.4), whereas for tools coated with AlTiN even a slight decrease in performance is found when such treatment has been applied.

Alternatively or even additionally a similar honing treatment by brush, blast, grinding operations or the like can be applied before the coating process.

EXAMPLE 6

A series of samples was prepared to test the influence of tungsten as a single alloying element. Coatings have been deposited according to parameters with No 1.2 and No 1.8,
Milling Conditions:

| | |
|---|---|
| Cutting tool: | 2-fluted ball nose end-mill, Ø 10 mm, micro grain carbide grade |
| Workpiece: | 1.2379 (62 HRC) |
| Spindle rotation: | 8000 min − 1 |
| Cutting speed: | 200 mmin − 1 |
| Feed rate: | 0.1 mm/tooth |
| Radial depth of cut: | 0.5 mm |
| Axial depth of cut: | 0.3 mm |
| Coolant: | compressed dry air |
| Milling operation: | down milling |
| Length of single pass: | 30 m |
| End of lifetime: | $v_{bmax}$ > 100 um at the end a single pass |

TABLE 6

| No. | coating | target composition support layer s.l. (% at) | | | target compostion main layer m.l. (% at) | | | | | thickness ratio m.l./s.l. | cutting performance lifetime at vb = 100 um (m) |
|---|---|---|---|---|---|---|---|---|---|---|---|
| | | Al | Cr | Ti | Al | Cr | Ti | Si | W | | |
| 6.1 | TiAlN/AlCrN | 50 | — | 50 | 70 | 30 | — | — | — | 2.30 | 120 |
| 6.2 | TiAlN/AlCrWN | 50 | — | 50 | 70 | 28 | — | — | 2 | 2.30 | 150 |
| 6.3 | TiAlN/AlCrSiWN | 50 | — | 50 | 57 | 31 | — | 10 | 2 | 2.30 | 270 |

In comparison to No. 6.1, No. 6.2 shows a slightly improved milling performance. This can be clearly attributed to the addition of W to the second AlCrN-based layer. In comparison to the optimized coating, having a different Al/Cr-ratio and containing additionally Si, there is still a gap.

EXAMPLE 7

With table 7 hardness and Young's modulus of a TiAlN layer corresponding to the support layer and a double layered inventive coating were measured. Measuring method was a Vickers micro hardness test at a 40 mN load resulting in a penetration depth of around 0.3 μM only. Therefore no significant influence from the substrate material and the support layer could be detected for the measurements. In comparison to the second coating the support layer is characterized by a lower hardness value and a higher Young's-modulus.

From examples in table 7 it is clear that inventive AlCrSiWN coated tools show a surprising increase in performance with hard-tooling operations when compared to AlCrN coatings of the state of the art.

EXAMPLE 8

With table 8 performance of a state of the art coating 8.1 and two inventive coatings 8.2 and 8.3 showing thermal induced phase transition as described in detail with FIG. 6 is shown. However with coating of target composition 8.2 evidence of hop phase as deposited was difficult to see. Only after 40 m of cutting a clear but definitely smaller signal than in FIG. 6 (B) with coating 8.3 could be detected.

| Cutting tool: | 6-fluted square endmill, micro grain carbide grade |
|---|---|
| Workpiece: | DIN 1.2379 (60 HRC) |
| Spindle rotation speed: | 7958 1/min |
| Axial depth of cut ae: | 8 mm |
| Radial depth of cut ap: | 0.1 mm |
| Feed rate fz: | 0.042 mm/tooth |
| Cutting speed vc: | 200 m/min |
| Coolant: | compressed air |
| Milling operation: | side milling |
| Length of single pass: | 10 m |
| End of lifetime: | $v_{bmax} > 150$ um |

| No. | coating | target composition support layer s.l. (% at) | | | target compostion main layer m.l. (% at) | | | | | thickness ratio m.l./s.l. | cutting performance lifetime at vb = 150 um (m) |
|---|---|---|---|---|---|---|---|---|---|---|---|
| | | Al | Cr | Ti | Al | Cr | Ti | Si | W | | |
| 8.1 | TiAlN | 50 | — | 50 | — | — | — | — | — | — | 40 |
| 8.2 | TiAlN/AlCrSiWN | 50 | — | 50 | 53 | 35 | — | 10 | 2 | 2.20 | 50 |
| 8.3 | TiAlN/AlCrSiWN | 50 | — | 50 | 57 | 31 | — | 10 | 2 | 2.30 | 75 |

Despite of the focus on hardtooling applications within the present description and examples above men of the art will know that such coatings may be applied advantageously also for other tools and tooling applications as for instance for forming operations like stamping and forging, or hot injection operations like die casting or moulding, as well as for engineering components especially for components having a need of high wear resistance and high hot hardness. Examples for such engineering applications might be parts of combustion engines, especially parts of the power train like cams and tappets, parts for fuel injection systems like injection needles and valve seats, piston rings and pins, high temperature bearings and the like.

TABLE 1

| No. | coating | target composition support layer s.l. (% at) Al | Cr | Ti | target compostion main layer m.l. (% at) Al | Cr | Ti | Si | W | atomic ratio m.l. Al/Cr | thickness ratio m.l./s.l. | cutting performance flank wear after 90 m (um) | lifetime at vb = 100 um (m) |
|---|---|---|---|---|---|---|---|---|---|---|---|---|---|
| 1.1 | TiAlN | — | — | — | 50 | — | 50 | — | — | — | — | 80 | 120 |
| 1.2 | AlTiN | — | — | — | 66 | — | 33 | — | — | — | — | 80 | 150 |
| 1.3 | AlCrN | — | — | — | 70 | 30 | — | — | — | 2.33 | — | 120 | 90 |
| 1.4 | AlCrSiWN | — | — | — | 62 | 26 | — | 10 | 2 | 2.38 | — | 70 | 150 |
| 1.5 | AlCrSiWN | — | — | — | 57 | 31 | — | 10 | 2 | 1.84 | — | 60 | 180 |
| 1.6 | TiAlN/AlCrN | 50 | — | 50 | 70 | 30 | — | — | — | 2.33 | 2.3 | 80 | 120 |
| 1.7 | AlCrN/AlCrSiWN | 70 | — | 30 | 62 | 26 | — | 10 | 2 | 2.38 | 2.2 | 40 | 270 |
| 1.8 | TiAlN/AlCrSiWN | 50 | — | 50 | 62 | 26 | — | 10 | 2 | 2.38 | 2.2 | 40 | 270 |
| 1.9 | TiAlN/AlCrSiWN | 50 | — | 50 | 57 | 31 | — | 10 | 2 | 1.84 | 2.3 | 50 | 300 |
| 1.10 | TiAlN/AlCrSiWN | 50 | — | 50 | 57 | 31 | — | 10 | 2 | 1.84 | 0.5 | 90 | 120 |

TABLE 2

| No. | Target composition support layer s.l. (% at) Ti | Al | Target composition main layer m.l. (% at) Al | Cr | Si | W | metal atomic ratio m.l. measured by EDX (Ti shows influence from support layer) (% at) Al | Cr | Si | Ti | W | Al/Cr | characterization XRD 1200/1111 | Hardness HV | Youngs M. (GPa) | cutting performance flank wear vbmax after 120 m | life time vbmax = 100 um |
|---|---|---|---|---|---|---|---|---|---|---|---|---|---|---|---|---|---|
| | | | | | | | Variation of the Si-content | | | | | | | | | | |
| 2.1 | 50 | 50 | 60 | 33 | 5 | 2 | 53.5 | 38.6 | 5.3 | 0.7 | 1.9 | 1.4 | 0.7 | 2840 | 425 | 110 | 120 |
| 2.2 | 50 | 50 | 57 | 31 | 10 | 2 | 49.9 | 36.7 | 10.5 | 1.0 | 1.9 | 1.4 | 0.9 | 2960 | 385 | 50 | 300 |
| 2.3 | 50 | 50 | 54 | 29 | 15 | 2 | 48.0 | 36.5 | 12.4 | 0.9 | 2.3 | 1.3 | 1.8 | 2930 | 367 | 75 | 270 |
| | | | | | | | Variation of the Al/Cr ratio | | | | | | | | | | |
| 2.4 | 50 | 50 | 62 | 26 | 10 | 2 | 56.7 | 30.2 | 10.4 | 0.7 | 2.1 | 2.0 | 0.7 | 2830 | 337 | 60 | 240 |
| 2.5 | 50 | 50 | 57 | 31 | 10 | 2 | 49.9 | 36.7 | 10.5 | 1.0 | 1.9 | 1.9 | 0.9 | 2960 | 385 | 50 | 300 |
| 2.6 | 50 | 50 | 53 | 35 | 10 | 2 | 47.3 | 39.5 | 10.7 | 0.7 | 1.8 | 1.7 | 1.4 | 3090 | 403 | 60 | 270 |

TABLE 5

| No. | coating | target composition support layer s.l. (% at) Al | Cr | Ti | target compostion main layer m.l. (% at) Al | Cr | Ti | Si | W | thickness ratio m.l./s.l. | brushing treatment | cutting performance No of pockets at vbmax = 100 um |
|---|---|---|---|---|---|---|---|---|---|---|---|---|
| 5.1 | AlTiN | — | — | — | 66 | — | 33 | — | — | — | no | 8 |
| 5.2 | AlTiN | — | — | — | 67 | — | 34 | — | — | — | yes | 6 |
| 5.3 | TiAlN/AlCrSiWN | 50 | — | 50 | 57 | 31 | — | 10 | 2 | 1.84 | no | 8 |
| 5.4 | TiAlN/AlCrSiWN | 50 | — | 50 | 57 | 31 | — | 10 | 2 | 1.84 | yes | 16 |

TABLE 7

| No. | coating | target composition support layer s.l. (% at) Al | Ti | target compostion main layer m.l. (% at) Al | Cr | Si | W | thickness ratio m.l./s.l. | thickness top layer (um) | hardness HUpl GPa | hardness Vickers HV | Young's modulus GPa |
|---|---|---|---|---|---|---|---|---|---|---|---|---|
| 7.1 | TiAlN | — | — | 50 | 50 | — | — | — | 4.7 | 35.7 | 2520 | 462 |
| 7.2 | TiAlN/AlCrSiWN | 50 | 50 | 57 | 31 | 10 | 2 | 1.84 | 2.5 | 50.8 | 2960 | 385 |

What is claimed is:

1. A workpiece having a surface whereas at least parts of said surface are coated with a wear resistant multilayered hard coating deposited by a PVD process, whereas the hard coating comprises at least a first supporting layer and a second layer, whereas the first layer is interposed between the workpiece and the second layer, whereas the first layer comprises a coating material of the following composition $$(Ti_aAl_{1-a})N_{1-x-y}C_xO_y$$

whereas $0.4<a<0.6$, and $0\leq x$ and $y<0.3$, or $$(Al_bCr_{1-b})N_{1-x-y}C_xO_y$$

whereas $0.5<b<0.7$, and $0\leq x$ and $y<0.3$;
the second layer comprises a coating material of the following composition $$(Al_{1-c-d-e}Cr_cSi_dM_e)N_{1-x-y}C_xO_y$$

whereas M stands for at least one element of the transition metals of group 4, 5, 6 of the periodic system except Chromium and $0.2<c\leq 0.35$, $0<d\leq 0.20$, $0<e\leq 0.04$; and the second layer comprises two different crystalline phases.

2. A workpiece according to claim 1, whereas the first layer comprises a coating material of the following composition $$(Ti_aAl_{1-a})N_{1-x-y}C_xO_y$$

whereas $0.4<a<0.6$, and $0\leq x$ and $y<0.3$, or $$(Al_bCr_{1-b})N_{1-x-y}C_xO_y$$

whereas $0.5<b<0.7$, and $0\leq x$ and $y<0.3$;
the second layer comprises a coating material of the following composition $$(Al_{1-c-d-e}Cr_cSi_dM'_{e'})N_{1-x-y}C_xO_y$$

whereas M' stands for W, Mo, Ta or Cb (Nb) and $0.2<c\leq 0.35$, $0.06\leq d'\leq 0.15$, $0<e\leq 0.04$.

3. A workpiece according to claim 1, whereas the second layer comprises two different crystalline phases.

4. A workpiece according to claim 3, whereas the different crystalline phases are a cubic face centered (fcc) and a hexagonale close packed (hcp) phase.

5. A workpiece according to claim 4, whereas an XRD signal of the hcp phase becomes more prone if subject to heat treatment or high working temperatures.

6. A workpiece according to claim 4, whereas the hcp phase is Al enriched.

7. A workpiece according to claim 4, whereas the percentage of the hcp phase as deposited is between 5 to 40 Vol %.

8. A workpiece according to claim 3, whereas the second layer exhibits a nanocrystalline growth structure in the SEM cross-section.

9. A workpiece according to claim 3, whereas the texture coefficient $Q_t=I(200)/I(111)$ of the nanocrystalline second layer is in the range of $0.7\leq Q_t\leq 2$.

10. A workpiece according to claim 1, whereas a quotient $Q_{Al/Cr}=(1-c-d-e)/c$ is within the following range: $1.7\leq Q_{Al/Cr}\leq 2.4$.

11. A workpiece according to claim 1, whereas a coating thickness D is within the following range: $1\ \mu m\leq D\leq 10\ \mu m$.

12. A workpiece according to claim 1, whereas a thickness $D_1$ of the first supporting layer is smaller than a thickness $D_2$ of the second coating.

13. A workpiece according to claim 1, whereas a hardness $HV_1$ of the first supporting layer is smaller than a hardness $HV_2$ of the second coating.

14. A work piece according to claim 1, whereas the first layer exhibits a columnar growth structure in the SEM cross-section.

15. A workpiece according to claim 1, whereas the first layer comprises a multiylayer of alternating $(Ti_aAl_{1-a})N_{1-x-y}C_xO_y$ and $(Al_{1-c-d-e}Cr_cSi_dM_e)N_{1-x-y}C_xO_y$ layers or of alternating $(Al_bCr_{1-b})N_{1-x-y}C_xO_y$ and $(Al_{1-c-d-e}Cr_cSi_dM_e)N_{1-x-y}C_xO_y$ layers.

16. A workpiece according to one of the claims 1, having a body made from high-speed steel, cemented carbide, cubic boron nitride, cermet or a ceramic material.

17. A workpiece according to claim 1, wherein the workpiece is a cutting tool.

18. Cutting process to cut a hard material, especially a material having a Rockwell hardness of HRC 50 or higher using the cutting tool from claim 17.

19. Cutting process according to claim 18, where the hard material is hardened steel.

20. A PVD process to provide a workpiece according to claim 1, comprising the step of heating the workpiece to a temperature higher than 550° C., especially to a temperature of about 600° C. and holding the temperature during the deposition process.

21. A PVD process according to claim 20, comprising the step of applying a first substrate voltage $U_1$ during deposition of the first coating and applying a second higher substrate voltage $U_2$ during deposition of the second coating.

22. A PVD process according to claim 21, whereas $0\ V\leq U_1\leq -100\ V$ and $-80\ V\leq U_2\leq -200\ V$, whereas $ôU_2-U_1ô\geq 20$.

23. A workpiece according to claim 1, whereas a coating thickness D is within the following range: $2\ \mu m\leq D\leq 6\ \mu m$.

24. A workpiece according to claim 1, wherein the workpiece is a cutting tool selected from the group consisting of: an end mill, a drill, a cutting insert, and a gear cutting tool.

* * * * *